United States Patent [19]

Thillays

[11] 4,228,490
[45] Oct. 14, 1980

[54] DISPLAY DEVICE FOR USE WITH STRONG ILLUMINATION

[75] Inventor: Jacques-Claude Thillays, Herouville-St-Clair, France

[73] Assignee: U.S. Philips Corporation, New York, N.Y.

[21] Appl. No.: 935,100

[22] Filed: Aug. 21, 1978

[30] Foreign Application Priority Data

Aug. 19, 1977 [FR] France ............................ 77 25406

[51] Int. Cl.² ............................................. F21V 3/00
[52] U.S. Cl. ................................... 362/311; 362/800
[58] Field of Search ................. 362/311, 800; 313/110

[56] References Cited

U.S. PATENT DOCUMENTS

| 3,510,732 | 5/1970 | Amans | 313/110 |
| 3,860,847 | 1/1975 | Carley | 313/110 |
| 4,035,681 | 7/1977 | Savage | 362/311 |
| 4,070,568 | 1/1978 | Gala | 362/311 |

*Primary Examiner*—Monroe H. Hayes
*Attorney, Agent, or Firm*—Thomas A. Briody; Jack Oisher; Steven R. Biren

[57] ABSTRACT

An electroluminescent device includes at least one emissive diode emitting in the red. The emissive face of the diode is covered by a filter element which is substantially transparent in the red, and which has a light transmission coefficient in the blue which is significantly higher than its coefficient in the yellow and the green. The resulting device exhibits superior contrast in sunlight, and is thus particularly suitable for use in vehicle and aircraft dashboard displays.

8 Claims, 2 Drawing Figures

DISPLAY DEVICE FOR USE WITH STRONG ILLUMINATION

The present invention relates to an electroluminescent device comprising at least one emissive diode emitting in red, of which diode the emission face is covered by a filter element substantially transparent in the red.

As is known, the reading of information given by an electroluminescent diode is sometimes difficult when the latter is in broad sunlight.

In fact, reading is based on the contrast between light beams. In electroluminescent devices the contrast is restricted to that of the light intensity—with respect to the ambient light—of a beam which originates from an emissive face, according as same is activated or not. The so-called "display devices" comprise a plurality of emissive faces, each face corresponding to a diode of a given shape which can be activated either simultaneously to form a total pattern, or separately to form partial patterns and a background. The reading of such devices is based on the variation in contrast between the light beams originating on the one hand from at least a part of the emissive face and on the other hand from the remainder of the surface of the device according as the emissive faces are activated or not.

In fact, the semiconductor material forming the emissive faces has a brighter tint than the background of the devices and it reflects slightly; illumination in broad sunlight consequently makes the total pattern appear permanently, even if only certain portions are activated.

On the other hand, each of the emissive faces is surrounded by metal contact parts the contours of which are to an approximation analogous to those of the said faces. Each light beam which impinges on the surface of the device produces a reflection on said metal parts which reduces the contrast effect.

Various attempts have already been made to mitigate these defects. For example, the background including the contact parts has been obscured by means of black lacquer, but this cannot be done without difficulties due to errors in placing the masks, taking into account the very small dimensions of the relevant faces and parts.

On the other hand, attempts have been made to eliminate the greater part of the disturbing sunlight by means of filters which, in the range of light frequencies, pass only a band which covers the emissive band of the relevant electroluminescent diode. Sometimes the encapsulation has been made to serve as the filter.

The present tendency is to reduce the bandwidth of the filter as much as possible. For example, it is usual to choose a pass filter for large wavelengths for a red electroluminescent display device with a wavelength limit in the order of 0.6 micrometer. However, experience has proved that this is quite insufficient and that numerous errors remain possible in panels thus constructed, especially because the wavelength of the light reflected by the filter is substantially the same as that of the radiation emitted by the diode.

The present invention provides a solution to this problem of the difficulty of reading an electroluminescent device with strong illumination. It starts from the basic concept that the contrast effect depends not only on the respective brightnesses of the electro-luminescent device and its environment but also on their respective colors.

According to the invention, an electroluminescent device having at least one emissive diode which emits in the red and has an emissive face which is covered by a filter element which is substantially transparent in the red is characterized in that the light transmission coefficient of the element in the blue is significantly higher than the light transmission coefficient of the same element in the yellow and in the green. The light transmission coefficient is preferably higher than 70% for radiation the wavelengths which lie between 0.45 and 0.48 $\mu$m (blue) and lower than 60% for the radiations the wavelengths of which lie between 0.52 and 0.58 $\mu$m (yellow).

The present invention gives remarkable results. Taking into account the composition of sunlight, in which the energy transmitted in the blue is considerably more important than the energy transmitted in the red, the device appears blue when the diode or the diodes is or are not activated.

The blue, which in normal illumination is dark, becomes bright in the sun. When at least one of the diodes belonging to a pattern is activated, it becomes visible in the red via the filter. With normal illumination, daylight or artificial light, it is visible in the red via a dark tinted filter. In direct sunlight the activated diode is visible in the red via a bright blue filter. The color difference between the red and the blue provides a clear distinction and the difference between the condition of energisation and nonenergization of the diode is determinable without hesitation. This is the important advantage of the device according to the invention.

Devices in accordance with the invention are particularly suitable for use in equipment on the dashboard of vehicles and aircraft.

In a particularly interesting embodiment which may be used in an electroluminescent diode, the light-emissive crystal is secured to a supporting face or on one of the electrodes of the diode and is protected by an envelope (which is generally referred to as cap), and the filter element is of color resin, usually in the solid state, occupying the space between the supporting face or the electrodes and the said cap.

The invention will be described in greater detail with reference to the accompanying drawing.

Figure 1:
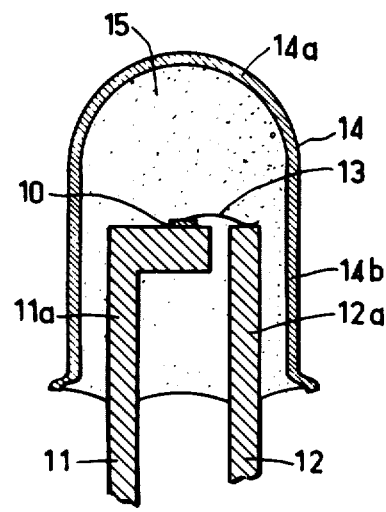
FIG. 1 is a sectional view according to a plane through the axis of the system of an electroluminescent device having a filter element according to the invention.

The electroluminescent diode whose known structure is shown in a simplified manner in FIG. 1 comprises a semiconductor crystal 10 which emits light and is secured to a supporting electrode 11 by soldering. The crystal 10 is, for example, a gallium phosphide crystal or a gallium phosphidearsenide crystal emitting in the red and the spectral characteristic of which is centered substantially at 0.65 $\mu$m, for example, in the medium red.

Said crystal 10 is connected electrically to a second electrode 12 by means of a flexible connection 13. The assembly of crystal 10 and uppermost portions 11a and 12a of the electrodes 11 and 12 is accommodated in an envelope or cap 14. The cap 14 comprises in known manner an uppermost portion 14a which is placed opposite to the emissive face of the crystal 10 and a semipherical or more complexly profiled shape and which continues in a portion 14b or side jacket which extends laterally along the electrodes. In the present case the cap is of a rigid plastic material which is relatively thin and which is transparent substantially to an equal extent over the entire visible spectrum. The free space inside the cap is filled with a solidified resin 15 which serves as a stiffening mechanical connection element between the above-mentioned parts 10, 11, 12, 13 and 14 of the electroluminescent diode and which in accordance with the invention also serves as a filter element.

More accurately, according to the invention the element 15, which is substantially transparent in the red has a higher light transmission coefficient in the blue than in the yellow and in the green. This is illustrated in the graph shown in FIG. 2 for a filter element manufactured by Applicants and for which the composition and the mode of preparation of the basic material will be stated hereinafter.

Figure 2:
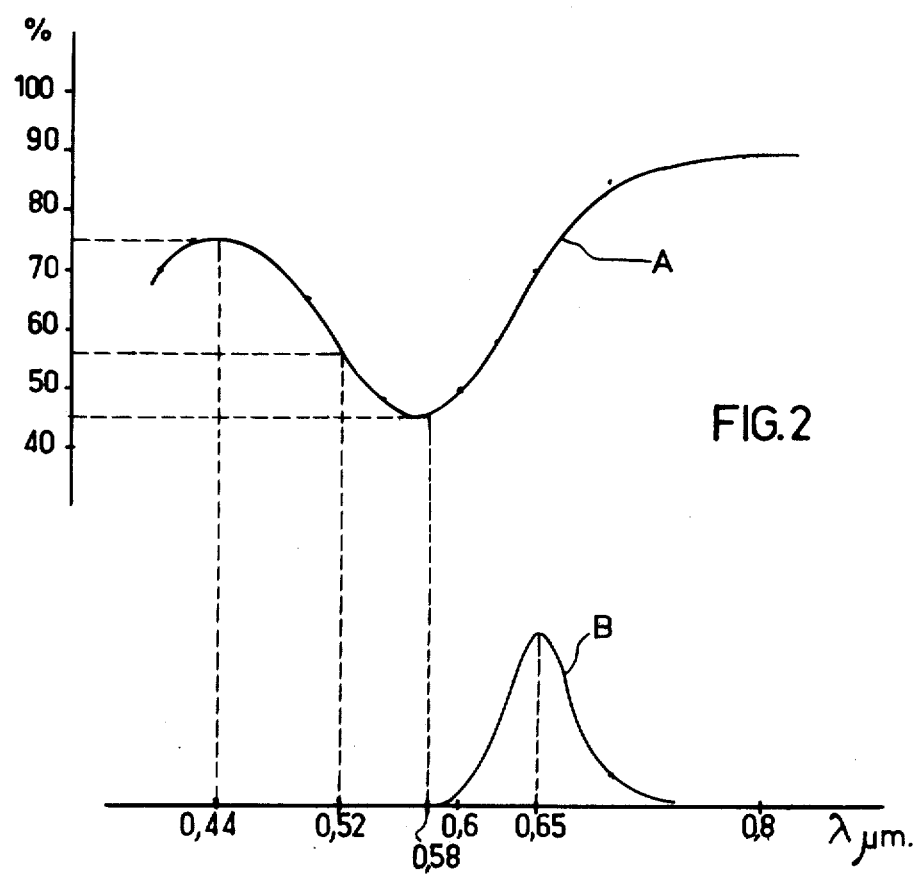
FIG. 2 is a graph showing the lighttransmission coefficients of a filter element in accordance with the characteristic features of the invention, of which filter element the composition will be given as the description proceeds.

On the vertical axis of the graph of FIG. 2 are plotted in percent the values of the light transmission coefficient, while on the horizontal axis the wavelengths in micrometers of the spectrum in the visible part are plotted.

It is indicated in the graph (curve A) that the light transmission coefficient of the filter element which is equal to or larger than 70% for radiation in the wavelength band between 0.40 and 0.48 μm—for example in the band of violet, indigo and blue—otherwise are substantially lower than 60% for the radiations the wavelengths of which lie between 0.52 and 0.58 μm, for example in the band of the green and the yellow and this reaches and then exceeds very clearly 70% from $\lambda = 0.65$ μm, for example in the band of the red.

With such a filter, which relatively absorbs radiation from the center of the visible spectrum more readily than radiation from the ends of said spectrum, a contrast effect is obtained between the red flux emitted by the crystal 10 (light flux of which the curve B which is also shown in FIG. 2 represents the spectral distribution for a diode which mainly emits in the medium red, for example at wavelengths near 0.65 μm), and the blue of the filter no matter what is the intensity of the ambient illumination. Especially with direct solar illumination, the red light flux distinguishes very noticeably from the azure under which the said filter then appears.

In a favorable embodiment of the electroluminescent diode in accordance with the invention the filter element is of a transparent thermosetting plastic material which comprises a comparatively small dose of a dye of the shade blue-violet.

The said thermosetting plastic material is, for example, a synthetic epoxy resin of the cycloaliphatic series to which in known manner a so-called hardener has been added previously, for example, a hardener of the carboxylane anhydride series, and possibly a so-called accelerator. For example, the resin is chosen which is commercially available from CIBA as CY 179 resin and the hardener which is mentioned HT 907 by said firm, benzyldimethylamide is then preferably used as an accelerator.

As regards the dye it is of course convenient to select a material soluble in such a mixture. Applicants preferably use a dye which is selected among the condensation products resulting from the reaction between a hydroxyanthraquinone and an amine. It is known that many dyes have been or are obtained in this manner, the methods of manufacturing these products and the products themselves forming the subject of numerous patents.

The dye preferably but not exclusively used by Applicants has the following chemical formula:

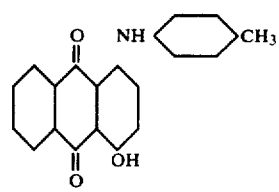

and the chemical indication anthraquinone 4-hydroxy-1-p-aminotoluene.

It results essentially from the reaction between, for example, quinizarin, for example leucoquinizarin, or 1 bromo (or chloro)-4 hydroxyanthraquinone with p-toluidine.

The experiments performed by Applicants to manufacture the electroluminescent devices with filter element according to the invention have demonstrated that the relative quantity of dye which initially should be incorporated in the resin mixture is very small. This quantity lies between 0.008 and 0.012% of the weight of the resin used.

As an indication, an example is given hereinafter of the weight composition and the preparation of a resin mixture which is used as filter element 15 in the cap 14 of an electroluminescent diode as described with reference to FIG. 1, which diode emits in the red:

| | |
|---|---|
| cycloaliphatic epoxide resin | 100 ± 5 |
| carboxylane anhydride hardener | 105 ± 5 |
| benzyldimethylamine accelerator | 1 ± 0.5 |
| dye as mentioned above | 0.01 ± 0.002. |

The light transmission characteristic which is obtained with such a colored resin is substantially that which corresponds to the graph shown in FIG. 2.

For the preparation of the above-stated resin mixture, first the dye which is used in the form of powder is dissolved in the epoxide resin heated at 80° C. The hardener is then heated at 60° C. so as to melt it and is then added to the colored resin which is kept at the temperature of 80° C. The assembly is then cooled to room temperature. The accelerator is then added. The caps may then be filled in their places on the respective diodes. Finally the device is annealed for 15 hours at 120° C. during which operation the reticulation of the resin mixture continues.

What is claimed is:

1. An electroluminescent device comprising at least one emissive diode emitting in the red, a filter element which is substantially transparent in the red and which covers the emissive face of said diode, the light transmission coefficient of said filter element in the blue being significantly higher than the light transmission coefficient of said filter element in the yellow and in the green.

2. An electroluminescent device as claimed in claim 1, wherein said light transmission coefficient is at least equal to 70% for radiation in the wavelength band of between 0.40 and 0.48 μm and said light transmission coefficient is lower than 60% for radiation in the wavelength band of between 0.52 and 0.58 μm.

3. An electroluminescent device as claimed in any of the preceding claims, wherein said filter element is manufactured from a thermosetting plastic material which in itself is transparent and which comprises a comparatively very small dose of a dye of the shade blue-violet.

4. An electroluminescent device as claimed in claim 3, wherein said plastic material is an epoxide resin of the cycloaliphatic series.

5. An electroluminescent device as claimed in claim 3, wherein said dye is selected from a group consisting of the condensation products of the reaction between a hydroxyanthraquinone and an amine.

6. An electroluminescent device as claimed in claim 5, wherein said dye consists of anthraquinone 4-hydro 1-p-aminotoluene according to the chemical formula

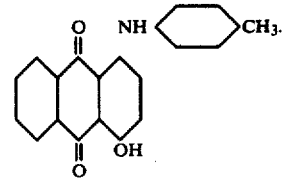

7. An electroluminescent device as claimed in claim 4, wherein the weight ratio between the dye and the resin is between 0.008 and 0.012%.

8. An electroluminescent device as claimed in claim 4, wherein the initially prepared resin mixture for the formation of filter elements has the following weight ratio:

| | |
|---|---|
| cycloaliphatic epoxide resin | 100 ± 5 |
| carboxylane anhydride hardener | 105 ± 5 |
| benzyldimethylamine accelerator | 1 ± 0.5 |
| dye | 0.01 ± 0.002. |

* * * * *